(12) United States Patent
Wittmann et al.

(10) Patent No.: US 10,739,257 B2
(45) Date of Patent: Aug. 11, 2020

(54) METHOD AND SYSTEM FOR THE RELATIVE REFERENCING OF A TARGET GAS IN AN OPTICAL MEASURING SYSTEM FOR LASER SPECTROSCOPY

(71) Applicant: Axetris AG, Kägiswil (CH)

(72) Inventors: Andreas Wittmann, Giswil (CH); Sven Schlesinger, Sachseln (CH); Torsten Platz, Weggis (CH)

(73) Assignee: Axetris AG, Kägiswil (CH)

( * ) Notice: Subject to any disclaimer, the term of this patent is extended or adjusted under 35 U.S.C. 154(b) by 40 days.

(21) Appl. No.: 16/149,295

(22) Filed: Oct. 2, 2018

(65) Prior Publication Data

US 2020/0103342 A1   Apr. 2, 2020

(51) Int. Cl.
*G01N 21/39* (2006.01)
*H01S 5/12* (2006.01)
(Continued)

(52) U.S. Cl.
CPC ............... *G01N 21/39* (2013.01); *G01J 3/10* (2013.01); *H01S 5/06808* (2013.01); *H01S 5/12* (2013.01)

(58) Field of Classification Search
CPC ............ G01N 21/39; G01N 2021/399; G01N 21/0303; G01N 2201/06113; G01J 3/10;
(Continued)

(56) References Cited

U.S. PATENT DOCUMENTS

| 4,684,258 A | * | 8/1987 | Webster | G01J 3/02 250/339.07 |
| 5,026,991 A | * | 6/1991 | Goldstein | G01N 21/39 250/339.04 |

(Continued)

*Primary Examiner* — Mohamed K Amara
(74) *Attorney, Agent, or Firm* — Renner, Otto, Boisselle & Sklar, LLP (57) ABSTRACT

A method for operating an optical measuring system including a wavelength-tunable temperature-stabilized laser light source for measuring the concentration of a target gas in a measured gas, wherein an instantaneous base current $I_{DC\_ZG,act}$ corresponding to a wavelength $\lambda_{ZG}$ of a target gas absorption line is set so that a wavelength distance $\Delta\lambda_{DC}$ defined during calibration between a target gas absorption line for a target gas and a reference gas absorption line for a reference gas is maintained. During operation, a temperature difference in the laser light source, defined in advance during calibration, between the operating points selected at the time of calibration of the reference gas, with a base current $I_{DC\_RG,cal}$, and the target gas, with a base current $I_{DC\_ZG,cal}$, is maintained by determining the required instantaneous base current $I_{DC\_ZG,act}$ for the target gas, as a function of an instantaneous base current $I_{DC\_RG,act}$ for the reference gas.

5 Claims, 7 Drawing Sheets (51) Int. Cl.
*H01S 5/068* (2006.01)
*G01J 3/10* (2006.01)

(58) Field of Classification Search
CPC . G01J 3/02; G01J 3/0262; G01J 3/433; H01S 5/12; H01S 5/06808; H01S 5/0612; H01S 5/0683
See application file for complete search history.

(56) References Cited

U.S. PATENT DOCUMENTS

| | | | | |
|---|---|---|---|---|
| 5,202,570 | A * | 4/1993 | Tanaka | G01N 21/39 250/205 |
| 5,301,014 | A * | 4/1994 | Koch | G01N 21/39 250/343 |
| 6,112,525 | A * | 9/2000 | Yoshida | F25B 21/02 62/3.2 |
| 6,618,148 | B1 * | 9/2003 | Pilgrim | G01N 21/1702 250/339.09 |
| 7,069,769 | B2 * | 7/2006 | Kung | G01N 21/05 73/24.02 |
| 7,508,521 | B2 * | 3/2009 | Liu | G01J 3/433 356/437 |
| 7,710,568 | B1 * | 5/2010 | Paige | G01J 3/0264 356/328 |
| 8,330,107 | B2 * | 12/2012 | Willing | G01N 21/39 250/336.1 |
| 8,594,143 | B2 * | 11/2013 | Willing | G01J 3/10 372/101 |
| 9,140,644 | B2 * | 9/2015 | Wittmann | G01N 21/39 |
| 9,377,359 | B1 * | 6/2016 | Wittmann | G01J 3/4338 |
| 9,711,937 | B2 * | 7/2017 | Feitisch | H01S 5/02272 |
| 10,175,166 | B1 * | 1/2019 | Wittmann | G01N 21/39 |
| 2002/0122308 | A1 * | 9/2002 | Ikeda | H01S 5/0427 362/259 |
| 2004/0032884 | A1 * | 2/2004 | Kitaoka | H01S 5/06256 372/20 |
| 2005/0213949 | A1 * | 9/2005 | Koren | C30B 31/12 392/416 |
| 2005/0276288 | A1 * | 12/2005 | Kitaoka | G01J 1/4257 372/20 |
| 2006/0163483 | A1 * | 7/2006 | Chabanis | B64D 37/32 250/339.12 |
| 2007/0246653 | A1 * | 10/2007 | Zhou | G01J 3/02 250/339.1 |
| 2010/0089117 | A1 * | 4/2010 | Liu | G01J 3/4338 73/1.03 |
| 2012/0281221 | A1 * | 11/2012 | Studer | G01J 3/02 356/437 |
| 2014/0247843 | A1 * | 9/2014 | Steinbacher | H01S 5/06808 372/20 |
| 2017/0219622 | A1 * | 8/2017 | Yang | G01Q 30/02 |

\* cited by examiner

METHOD AND SYSTEM FOR THE RELATIVE REFERENCING OF A TARGET GAS IN AN OPTICAL MEASURING SYSTEM FOR LASER SPECTROSCOPY

TECHNICAL FIELD OF INVENTION

The invention relates to a method for operating an optical measuring system for measuring the concentration of a target gas component (ZG) in a measured gas, comprising a wavelength-tunable temperature-stabilized laser light source, wherein an instantaneous base current $I_{DC\_ZG,act}$ corresponding to a wavelength $\lambda_{ZG}$ of a target gas absorption line is set so that a wavelength distance $\Delta\lambda_{DC}$ defined during the calibration between a target gas absorption line for a target gas component (ZG) and a reference gas absorption line for a reference gas component (RG) is maintained. The invention furthermore relates to a system for carrying out the method.

DISCUSSION OF RELATED ART

Optical measuring systems for measuring the concentration of a gas component in a measured gas, based on laser absorption spectroscopy (LAS), are known from the prior art in a wide variety of embodiments, as are a multitude of different methods for operating such an optical measuring system, such as wavelength modulation spectroscopy (WMS) and direct absorption spectroscopy (DAS). In LAS, exact setting of the laser wavelength to the wavelength of the absorption line for the target gas plays an important role in general. During calibration, the laser wavelength is usually defined by way of the operating point of the Peltier temperature (base laser temperature) and the base current $I_{DC}$ of the laser light source. However, long-term changes in the laser and the influence of the outside temperature result in a different wavelength for the selected operating point, which deviates from the absorption wavelength of the target gas, even if the base current $I_{DC}$ remains unchanged. Base current usually denotes a direct current (DC) having a maximum at the absorption line, with larger and smaller current values traversed around this, when the absorption line is being scanned. As a consequence, these changes also cause the sensor calibration to deviate from the specification limits, which then often necessitates a re-calibration of the optical measuring system.

So as to ensure that the wavelength of the target gas remains accurate (in particular in the absence of the target gas), usually one or more absorption lines for a reference gas are used, and the line locking principle is applied. The reference gas is either essentially permanently present in the process gas or is accommodated somewhere in the sensor itself, enclosed in a cuvette, for example. The cuvette can be implemented, for example, in the optical measuring path or in a special optical reference path (this requires a beam splitter and a further photodiode).

Often, it is not possible or useful to use the target gas itself as the reference gas, for example when this is not stable over a long time, when the line width associated therewith is too thin, which results from too short an absorption path and leads to a low absorption signal, or when this is too dangerous to produce or during operation.

As an alternative, a different gas (reference gas), which has one or more absorption lines in the vicinity of a target wavelength, can be used instead of the target gas. Reference is made to EP 2 307 876 B1 by way of example. This patent uses two $CH_4$ gas absorption lines to exactly reference the CO gas absorption line in the center. Often, however, the tuning range of the laser light source is not sufficiently wide to accurately reference a target gas absorption line in this way.

EP 2 307 876 B1 discloses a method for detecting at least one target gas by way of laser spectroscopy, using a laser light source having an emission wavelength that is monochromatic and tunable by varying the operating temperature or the operating current. So as to calibrate the wavelength scale of the laser light source relative to the varied operating temperature or the varied operating current, in the wavelength range of a band of the at least one target gas, a first laser light source tuning step is carried out across a first tuning width, wherein at least two absorption lines for a reference gas and at least one absorption line for the at least one target gas are present. Thereafter, a second laser light source tuning step is carried out across a second tuning width in the wavelength range of the band of the at least one target gas, wherein the second tuning width is narrower than the first tuning width, and wherein at least one of the at least one absorption line for the at least one target gas is present. The target gas and the reference gas are different gases. The first tuning step for calibrating the laser current or the laser temperature is carried out once with the absolute wavelength scale, and the second tuning step for detecting the at least one target gas is carried out consecutively several times. The second tuning width is compared to a calculated absorption spectrum, wherein non-iterative curve fitting using a linear regression algorithm is employed so as to calculate the concentration of the at least one target gas in one step. This procedure requires a reference gas that has at least two absorption lines in the vicinity of the target gas absorption line, which are within the tuning range of the laser. Moreover, this procedure is time-consuming since it requires that two reference lines be detected and evaluated.

For activating a wavelength-tunable laser diode in a spectrometer using no reference gas, it is known from DE 10 2013 202 289 A1 to predefine a power-time function, in accordance with which the laser diode is tuned periodically over a wavelength range, by ascertaining a current profile, which is used to activate the laser diode, from the power-time function and the measured values of the voltage present at the laser diode. The current profile that is used to directly activate the laser diode is generated by a control unit as a function of the control deviation between the power consumption (actual variable) of the laser diode and the predefined power-time function (target variable), wherein the voltage present at the laser diode and the current through the laser diode are continuously detected, for example measured, and the power consumption of the laser diode is ascertained continuously by multiplying the measured current and voltage values. No reference gas is used therein, and thus a different wavelength range is detected when the temperature of the Peltier element (Peltier temperature) on which a laser chip is disposed and/or the outside temperature change, even though the power-time function is predefined. This method is too imprecise for referencing a target gas. Moreover, the entire voltage across the laser is measured, which is too imprecise for determining the wavelength.

If only one reference gas line, which is not the target gas line, is available for the use of a reference gas, it is essential to ensure that the wavelength distance $\Delta\lambda_{DC}$ between the target gas and the reference gas is kept constant during operation for different laser currents, and thus different laser temperatures. Moreover, the distance must also remain constant when the laser ages. In principle, it would be possible to simply scan a certain wave range. However, the detection limit is drastically limited due to present noise, resulting from optical interference phenomena, for example, and the presence of absorption lines for other gases in the measured spectrum. It is therefore important to adhere to the wavelength distance very precisely.

The wavelength distance between the target gas and the reference gas is typically set by a constant current distance ΔI. Due to the non-linear DC tuning behavior of the laser, a shift (drift) of the operating point, for example as a result of the influence of the outside temperature on the temperature stabilization or aging of the laser/electronics, results in a distance error for the wavelength distance. This results in the target gas component (absorption line for the target gas) being presumed to be in an incorrect location. In some instances, this results in considerable measurement errors.

Proceeding from this, it is the object of the claimed invention to propose a different, more precise, effective and easy to implement option for keeping the wavelength distance between the target and reference gas lines constant, despite changing laser properties, such as operating current, operating temperature or long-term drift.

SUMMARY OF THE INVENTION

This object is achieved according to the invention by a method for operating an optical measuring system for measuring the concentration of a target gas component in a measured gas having the features of described herein and by a system in the form of a measuring system described herein. Further advantageous embodiments can be derived from the respective dependent claims.

The core idea of the invention is, instead of using a fixed current difference value, to set the current difference in such a way that a previously defined relative temperature difference is maintained between the reference and target gas (peak) positions, which is to say between the respective absorption lines, for the calculation of the presumed wavelength position of the target gas. This temperature difference is calculated from the difference of the temperatures that are generated by the respective introduced electrical powers at an internal resistance of the laser light source at the peak positions of the target and reference gases at the time of calibration. This relative temperature difference is proportional to the wavelength distance of the absorption lines for the target and reference gases, and thus this procedure ensures that the target wavelength can always be exactly determined.

For example, this method advantageously allows applications in which reference gas and target gas absorption lines are significantly distanced from each other to be easily implemented. Monitoring for methane leaks shall be mentioned here by way of example, where, in addition to $CH_4$, $C_2H_6$ (ethane) also has to be measured to confirm that natural gas is involved. The reference gas used is methane (which, in this case, also represents the second target gas), which is accommodated in the optical path of the laser in the sensor for this purpose. Depending on the selected absorption lines, the distance between the reference gas (methane) and the target gas (ethane) is between 0.6 and 1.0 nm here. Since this distance is considerable, it is no longer possible to use a fixed current value. Additionally, there is an advantage in that the calibration is particularly simple, as compared to the conventional calibration methods known from the prior art.

The abbreviations RG and ZG used hereafter denote a reference gas, or a reference gas component in a gas, and a target gas, or a target gas component in a measured gas. The designations DC and AC used are common and thus known to a person skilled in the art as designations for DC voltage/direct current and AC voltage/alternating current. These refer to electrical currents, voltages and/or powers and indicate the respective type. Moreover, the abbreviation L is used for the laser light source or, in general, for the laser. The abbreviations RG, ZG, DC, AC and L are used for clarification in the claims and in the overall description, and in particular in the formulas below. The base current $I_{DC}$ denotes, in summary, all the base currents corresponding to the respective operating states (calibration, instantaneous base current) and associated gases (RG, ZG).

According to the invention, in the method, during operation, a relative temperature difference in the laser light source, defined in advance during the calibration, between the operating points, selected at the time of calibration, of the reference gas (RG), with a base current $I_{DC\_RG,cal}$, and the target gas component (ZG), with a base current $I_{DC\_ZG,cal}$, is maintained by determining the required instantaneous base current $I_{DC\_ZG,act}$ for the target gas component, as a function of an instantaneous base current $I_{DC\_RG,act}$ for the reference gas.

The calibration of the measuring system is preferably carried out with the reference gas and the target gas. During the calibration, the base currents $I_{DC\_RG,cal}$ and $I_{DC\_ZG,cal}$, assigned to the gas absorption lines for the reference gas RG and of the target gas component ZG are established, the associated electrical powers $P_{DC\_RG,cal}$ and $P_{DC\_ZG,cal}$ of the laser light source are determined, and a power difference $\Delta P_{DC,\ cal}$ is found therefrom, which is stored.

According to the invention, moreover, during operation of the measuring system, the electrical power $P_{DC\_RG,act}$ of the laser source assigned to the gas absorption line for the reference gas is then ascertained, the electrical power $P_{DC\_ZG,act}$ of the laser source assigned to the gas absorption line for the target gas ZG is determined as the sum of the electrical power $P_{DC\_RG,act}$ and the power difference $\Delta P_{DC,\ cal}$, and the assigned base current $I_{DC\_ZG,act}$ is calculated from the electrical power $P_{DC\_ZG,act}$ of the laser source thus determined.

In other words, this means that, during the calibration, the DC laser currents of the peak positions of the reference gas and the target gas are established, the electrical DC power dropping across the internal resistance of the laser is ascertained for the two peak positions by detecting the internal resistance of the laser at the respective current position or, alternatively, an equivalent variable, for example using lock-in technology. At the time of calibration, the power difference $\Delta P_{DC,\ cal}$ of the DC powers, or at least an equivalent variable, is ascertained and stored in the sensor. The power difference is preferably determined according to formula F 10 listed below. As an alternative, it would also be possible to store the variables indicated in formula F 10 in the sensor.

During operation of the measuring system, the electrical DC power dropping across the internal resistance of the laser is determined for the instantaneous peak position of the reference gas. The internal resistance measurement can be implemented, in particular, by lock-in technology. Since the operating point may shift due to drift, the electrical power $P_{DC\_RG,act}$ is recalculated on a regular basis (and thus cannot be assumed to be a fixed value). Moreover, the instantaneous electrical power at the peak position for the target gas is determined by adding the instantaneous power for the reference gas peak and the power difference. From the instantaneous power of the peak for the target gas, the DC current for the peak position thereof is preferably ascertained according to formula F 11 listed below. Thereafter, the measuring scan for the target gas is carried out at the ascertained peak position for the target gas, and the gas concentration is ascertained therefrom. The base current defines the position at which the absorption characteristic curve has a maximum. Scanning with larger and smaller current values is carried out around this maximum to ascertain the concentration.

The proposed method is used for the initial calibration of the measuring system by the manufacturer and can also be utilized by the user for potentially necessary subsequent calibration.

In wavelength modulation spectroscopy, as is customary, a wavelength-tunable temperature-stabilized laser light source is used, which periodically varies a central base wavelength of the laser light of the laser light source by changing the base current via a relevant absorption line for the gas component at an operating point and, at the same time, modulates the same with a frequency (f) and a determinable amplitude by way of a modulation device. Using a light detector, the intensity of the laser light after it has passed through the measured gas is detected. An evaluation unit is used, which comprises means for the phase-sensitive demodulation of a measuring signal generated by the light detector at the frequency (f) and/or one of the harmonics thereof, wherein the laser light source is operated in a current-modulated manner with a base current $I_{DC}$ and a modulation current $I_{AC}$ and emits a laser beam of the wavelength having a wavelength modulation amplitude $\Delta\lambda_{AC}$, and the wavelength modulation amplitude $\Delta\lambda_{AC}$ of the laser light is kept constant by way of variable setting of the current modulation amplitude $\Delta I_{AC}$.

However, long-term changes in the laser may make it necessary to adapt the base laser temperature. However, this also necessitates a correction of the previously calculated power difference $\Delta P_{DC,cal}$. If the laser temperature is being varied, formula F 15 should be preferred over formula F 11 for calculating the base current $I_{DC\_ZG,act}$. For this purpose, the laser temperature is stored at the time of calibration.

According to a preferred method step, the respective internal resistances are required for calculating the electrical power at the respective base currents (for the target and reference gases). It should be noted that the exact internal resistance may iterate only after multiple measurements.

The internal resistance $R_I$ of the laser light source is preferably determined from a voltage/current characteristic curve for the laser light source in which the voltage drop $U_L$ across the laser light source is recorded as a function of the base current $I_{DC}$. The respective internal resistances are ascertained at the peak positions of the reference gas and the target gas. The voltage/current characteristic curve of the laser light source is usually recorded for the first time during the calibration of the optical measuring system. It is not necessary to measure the entire curve, but only a region around the operating point, so as to correctly determine the respective internal resistance $R_I$ from the slope in this region. A multitude of measurements can be carried out in the region, and the result can be averaged. As an alternative, the slope can also be ascertained using lock-in technology, which has the advantage that noise is reduced. The resistance values are also ascertained during operation on a regular basis, and preferably these are re-determined during every concentration measurement.

During calibration and during regular operation of the optical measuring system, an evaluation unit comprising lock-in technology is preferably used for determining the concentration of a target gas component, so as to achieve noise reduction in the known manner, in particular in order to considerably lower the noise caused by the 1/f signal. A lock-in amplifier, which is also sometimes referred to as a phase-sensitive rectifier or carrier frequency amplifier, is an amplifier for measuring a weak electrical alternating signal, which is modulated with a reference signal having a known frequency and phase. The device represents an extremely narrow-band bandpass filter, thereby improving the signal-to-noise noise ratio. The advantage when using such a device is that DC voltages and AC voltages having different frequencies and noise are efficiently filtered.

According to the invention, the method described above is based on the formulas provided below. These are used during calibration and/or during operation. Values from calibration are denoted by "$_{cal}$" and values from operation are denoted by "$_{act}$."

Heretofore, the instantaneous current position of the target gas (ZG) is determined in relative terms by the position of the reference gas (RG) using the following formula:

$$I_{DC\_ZG,act} = I_{DC\_RG,act} + \Delta I \quad (F\ 1)$$

where $\Delta I$ is a fixed current value, which is established during calibration:

$$\Delta I = I_{DC\_ZG,cal} - I_{DC\_RG,cal} \quad (F\ 2)$$

Due to the aforementioned non-linear DC tuning behavior of the laser, this procedure is not sufficiently exact for determining the position of the ZG. It is apparent from $$\frac{1}{\lambda}\frac{d\lambda}{dT} = \frac{1}{n_{eff}}\frac{dn_{eff}}{dT} + \frac{1}{L_{eff}}\frac{dL_{eff}}{dT} \quad (F\ 3)$$

that a wavelength change can be described by a temperature change, where $n_{eff}$ is the effective refractive index, and $L_{eff}$ is the effective resonator length of the laser. Taking into consideration that the first term on the right side of the above formula is dominant over the second term, a wavelength change is given by:

$$\Delta\lambda = \lambda \cdot \frac{1}{n_{eff}}\frac{dn_{eff}}{dT} \cdot \Delta T \quad (F\ 4)$$

So as to calculate the presumed position of the target gas, instead of using a fixed current difference value (that was determined during calibration according to formula F 2), the current difference is set during ongoing operation in such a way that a defined temperature difference $\Delta T_{act}$ is maintained between the reference and target gas (peak) positions. This results in the following temperature at the instantaneous position of the target gas:

$$T_{ZG,act} = T_{RG,act} + \Delta T_{act} \quad (F\ 5)$$

wherein the temperature at the position of the reference gas peak is given by:

$$T_{RG,act} = P_{DC\_RG,act} \cdot R_{th,act} = I_{DC\_RG,act}^2 \cdot R_{I\ RG,act} \cdot R_{th,act} \quad (F\ 6)$$

wherein the electrical power is converted via the thermal resistance $R_{th,act}$ into the temperature $T_{RG,act}$, and the power is produced by the laser current $I_{DC\_RG,act}$ in the internal resistance $R_{I\ RG,act}$.

The instantaneous temperature $T_{ZG,act}$ at the position of the target gas peak is coupled to the sought laser current $I_{DC\_ZG,act}$ via the thermal resistance and electrical resistance:

$$T_{ZG,act} = P_{DC\_ZG,act} \cdot R_{th,act} = I_{DC\_ZG,act}^2 \cdot R_{I\ ZG,act} \cdot R_{th,act} \quad (F\ 7)$$

If the laser temperature does not change during operation, then:

$$\Delta T_{act} = \Delta T_{cal} = \Delta P_{DC,cal} \cdot R_{th,cal} = \quad (F\ 8)$$
$$(I_{DC\_ZG,cal}^2 \cdot R_{I\ ZG,cal} - I_{DC\_RG,cal}^2 \cdot R_{I\ RG,cal}) \cdot R_{th,cal}$$

The aforementioned temperature difference $\Delta T_{cal}$ is calculated as the difference of the temperatures that are generated by the respective introduced electrical powers at the internal resistance at the peak positions of the target and reference gases at the time of calibration. Since the temperature difference is proportional to the wavelength difference between ZG and RG, this procedure ensures that the target wavelength is always exactly determined.

By inserting formulas (F 6), (F 7) and (F 8) in formula (F 5), the sought laser current at the position of the target gas is found:

$$I_{DC\_ZG,act} = \sqrt{\frac{I_{DC\_RG,act}^2 \cdot R_{I\ RG,act} + \Delta P_{DC,cal} \frac{R_{th,cal}}{R_{th,act}}}{R_{I\ ZG,act}}} \quad (F\ 9)$$

wherein a power difference ("fixed power") results using the values at the time of calibration:

$$\Delta P_{DC,cal} = I_{DC\_ZG,cal}^2 \cdot R_{I\ ZG,cal} - I_{DC\_RG,cal}^2 \cdot R_{I\ RG,cal} \quad (F\ 10)$$

Assuming that the thermal resistance does not change during operation ($R_{th,act}=R_{th,cal}$), the following results for the peak position of the target gas:

$$I_{DC\_ZG,act} = \sqrt{\frac{I_{DC,RG,act}^2 \cdot R_{I\ RG,act} + \Delta P_{DC,cal}}{R_{I,ZG,act}}} \quad (F\ 11)$$

It should be noted that the exact internal resistance $R_{I\ ZG,act}$ is not known initially and would have to be measured (at the location $I_{DC\_ZG,act}$). After running through the formula several times, or after multiple measurements, however, the value iterates very quickly, and the internal resistance is correctly ascertained at the location $I_{DC\_ZG,act}$.

If, additionally, the operating point of the base laser temperature $T_L$ changes (for example, if the Peltier temperature is adapted during operation so as to compensate for excessively large wavelength shifts on the current scale due to the adaptation of the base laser temperature), from the constant relative temperature change condition:

$$\frac{\Delta \lambda}{\lambda} \cong \frac{\Delta T}{T} \quad (F\ 12)$$

then the following relationship for the instantaneous temperature difference follows:

$$\Delta T_{act} = \Delta T_{cal} \frac{T_{L,act}}{T_{L,cal}} = \Delta P_{DC,cal} \cdot R_{th,cal} \frac{T_{L,act}}{T_{L,cal}} \quad (F\ 13)$$

wherein the temperatures are to be used in Kelvin. The resulting current is given by:

$$I_{DC\_ZG,act} = \sqrt{\frac{I_{DC\_RG,act}^2 \cdot R_{I\ RG,act} + \Delta P_{DC,cal} \frac{R_{th,cal}}{R_{th,act}} \cdot \frac{T_{L,act}}{T_{L,cal}}}{R_{I\ ZG,act}}} \quad (F\ 14)$$

If a change in the thermal resistance can be neglected, it again follows that:

$$I_{DC\_ZG,act} = \sqrt{\frac{I_{DC,RG,act}^2 \cdot R_{I\ RG,act} + \Delta P_{DC,cal} \frac{T_{L,act}}{T_{L,cal}}}{R_{I\ ZG,act}}} \quad (F\ 15)$$

It is commonly known that each laser light source circuit diagram can be replaced with an equivalent circuit, which comprises a laser emitter (active zone) and an internal resistance $R_I$ connected in series thereto. As soon as a base current $I_{DC}$ flows through the laser light source, a voltage $U_L$ is present at the laser light source, which in part drops across the laser emitter as a partial voltage $U_E$ and across the internal resistance $R_I$ as a partial voltage $U_{RI}$, where $U_E$ typically has a value of 0.9 to 1.1 V, depending on the laser type (having a wavelength close to that common in the telecom industry). In the case of WMS, additionally a modulation current $I_{AC}$ is added to the base current; however, this does not affect this method since the temperature changes average out over time.

The instantaneous DC power at the position of the reference gas peak is calculated from the base current $I_{DC\_RG,act}$ flowing through the laser light source, and the voltage drop $U_{RI\_RG,act}$ occurring at the internal resistance $R_{I\_RG,act}$ as $$P_{DC\_RG} = I_{DC\_RG,act} \cdot U_{RI\_RG,act} = I_{DC\_RG,act}^2 \cdot R_{I\ RG,act} \quad (F\ 16 6)$$

The calibration of the optical measuring system takes place substantially according to the common method that is routine to the person skilled in the art by way of a known reference gas, which may also be a target gas, and the actual target gas itself. So as to establish the operating point of the laser light source, first the temperature of the temperature-stabilized laser light source is varied until the absorption signals for the reference and target gases are detected at a desired operating point. Thereafter, the power difference is ascertained and stored.

The system according to the invention is composed of a measuring system for carrying out the method, comprising a modulation device (4) for providing the base current $I_{DC}$ for the laser light source, a receptacle for the measured gas, a light detector, and an evaluation unit (6) connected to the light detector and the modulation device, means for detecting the voltage present at the laser light source, means for detecting the laser base temperature, means for ascertaining the internal resistance of the laser light source, and means for controlling the base currents $I_{DC}$ for the reference gas (RG) and the target gas (ZG). It is particularly preferred when the reference gas is disposed in the optical path of the laser in the sensor, so that the laser beam emitted by the laser light source first passes through the reference gas, and thereafter through the measured gas, to the light detector. This allows for extremely compact design of the entire measuring system and production of easy-to-handle and easy-to-transport gas detection devices.

The features and feature combinations mentioned above in the description, and the features and feature combinations mentioned hereafter in the description of the figures and/or shown only in the figures, can be used not only in the respective indicated combinations, but also in other combinations, or alone. It is not necessary for all the features recited in the claims to be implemented to carry out the invention. It is also possible to replace individual features of the independent or dependent claims with other disclosed features or feature combinations.

BRIEF DESCRIPTION OF THE DRAWINGS

The invention will be described again in more detail hereafter based on the accompanying drawings. In the drawings, in schematic illustrations.

DETAILED DESCRIPTION OF THE INVENTION

Figure 1:
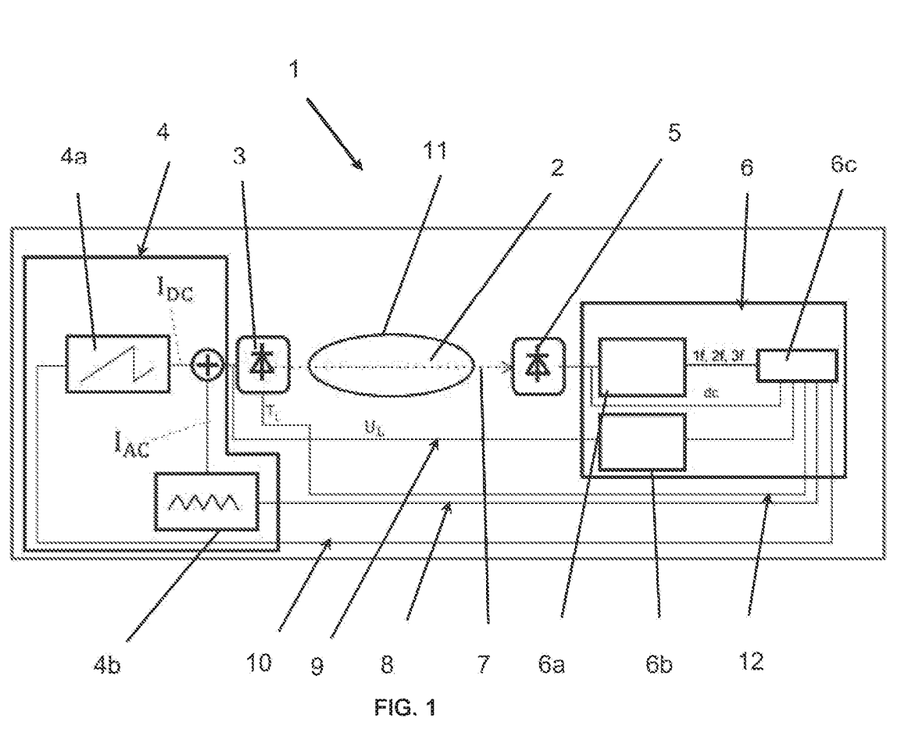
FIG. 1 shows an optical measuring system suitable for carrying out the method according to the invention.

FIG. 1 schematically shows the basic design of an optical measuring system 1 for measuring the concentration of a target gas component ZG in a measured gas 2, based on wavelength modulation spectroscopy (WMS). The measuring system 1 comprises a wavelength-tunable temperature-stabilized laser light source 3, a modulation device 4, a light detector 5, and an electronic evaluation unit 6. The laser light source 3 emits a laser beam 7 of the wavelength $\lambda_{DC}$ having a wavelength modulation amplitude $\Delta\lambda_{AC}$. The modulation device 4 periodically varies the wavelength of the laser light of the laser light source 3 by way of a reference absorption line and a target gas absorption line at an operating point and, at the same time, modulates the same in a triangular manner with a frequency (f) and a settable amplitude. This additionally comprises at least one DC and/or AC voltage source or a DC and AC current source 4a, and associated modulation means 4b for operating the laser light source 3. This can be used to variably set the respective base current $I_{DC}$ and the modulation current $I_{AC}$. The modulation device 4 is connected directly to the laser light source 3. The light detector 5 detects the laser beam 7 originating from the laser light source 3 after this has passed through the measured gas 2, and generates a reception signal, which is dependent on the intensity of the laser light after it has passed through the measured gas 2, and is supplied to the evaluation unit 6. The evaluation unit 6 comprises means for the phase-sensitive demodulation of a measuring signal generated by the light detector 5 at the frequency (f) and/or one of the harmonics thereof. The evaluation unit 6 comprises two lock-in amplifiers 6a, 6b and a processing unit 6c. The processing unit 6c evaluates the demodulated reception signal of the light detector 5. Furthermore, an electrical connecting line 9 leads to the lock-in amplifier 6b by way of which the voltage present at the laser light source 3 is detected and the internal resistance is determined. As a function thereof, the control unit controls the base currents $I_{DC}$ and modulation currents for the reference and target gases using the modulation device 4 so as to keep the wavelength distance between the reference gas and target gas constant. For this purpose, this comprises electrical control lines 8 and 10 to the modulation device 4. In the evaluation, primarily the above-described formulas F 11 or F 15 together with F 10 are used, among other things. Via the line 12, the Peltier temperature is transmitted to the control unit 6. In this exemplary embodiment, the reference gas RG is permanently present in the optical path during calibration. The target gas component ZG is then introduced into the measured gas chamber.

Figure 2:
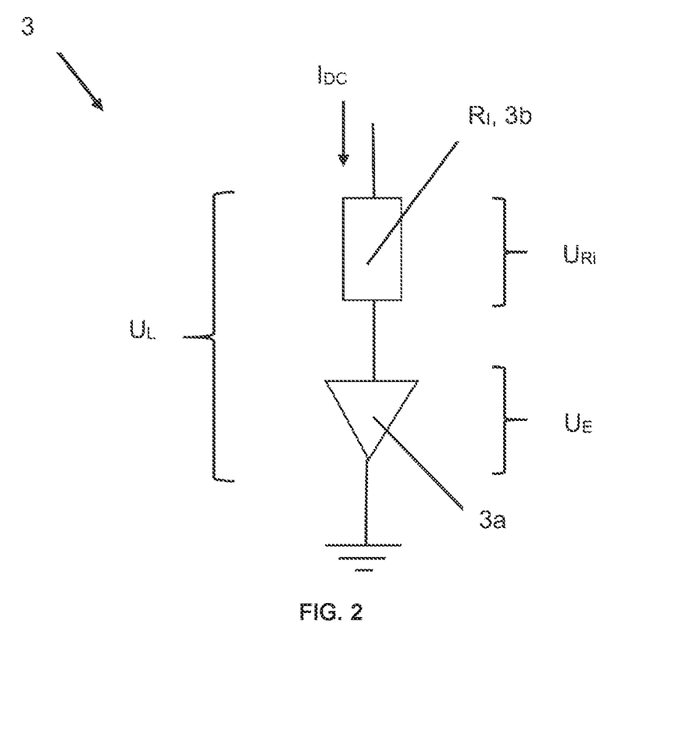
FIG. 2 shows the equivalent circuit for the laser light source.

FIG. 2 shows the equivalent circuit for the laser light source 3. The laser light source 3 can thus be arithmetically replaced with a light emitter 3a, and an internal resistance $R_I$, 3b connected in series thereto. The laser light source 3 is operated in a current-modulated manner with a base current $I_{DC}$ and a modulation current $I_{AC}$. Voltage $U_L$ is present at the laser light source 3 and drops partially across the internal resistance 3b as a partial voltage $U_{RI}$ and across the light emitter 3a as a partial voltage $U_E$.

Figure 3:
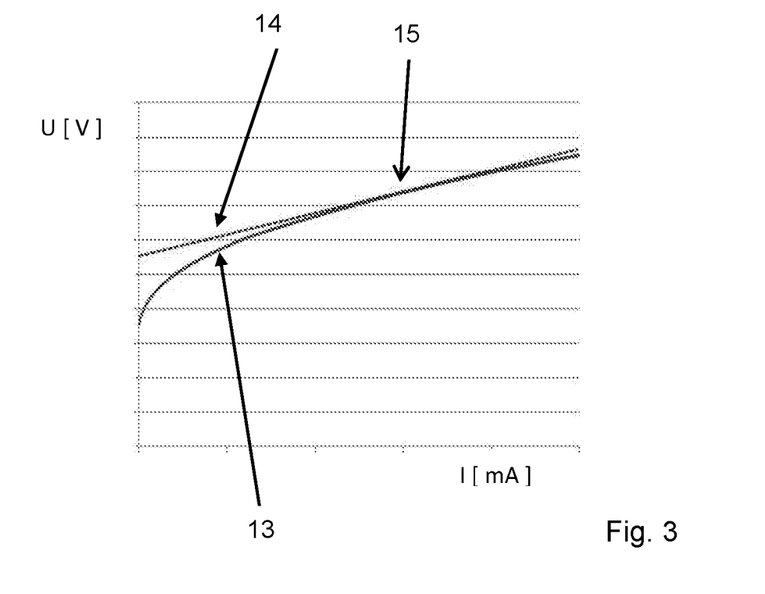
FIG. 3 shows a recorded voltage/current characteristic curve for determining the internal resistance of the laser light source.

FIG. 3 illustrates a current/voltage characteristic curve 13 recorded during the calibration of the optical measuring system 1 for determining the internal resistance $R_{I\,RG}$ of the laser light source 3 at the location of the reference gas. The internal resistance $R_{I\,RG}$ is determined from the relationship of the current/voltage characteristics of the laser light source 3 at the operating point 15 $I_{DC\_RG,cal}$ for RG. For this purpose, the current/voltage characteristic curve 13 (solid line) is provided with a linear approximation line 14 (dotted line) at the operating point 15 for determining the internal resistance $R_{I\,RG}$ at the location of the reference gas. The slope of the approximation line 14 corresponds to the internal resistance $R_I$, 3b at the operating point 15 with $R_{I\,RG}$. An analogous procedure is applied at the location of the target gas for ascertaining $R_{I\,ZG}$.

Figure 4:
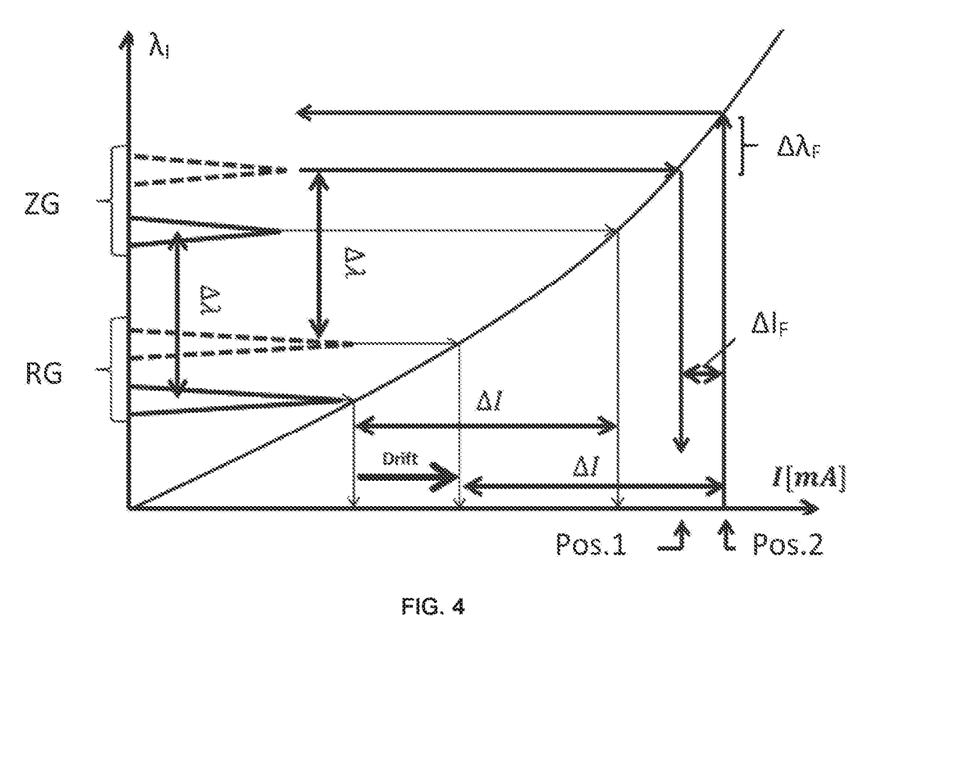
FIG. 4 shows the wavelength $\lambda_I$ as a function of the current in a schematic illustration of the target gas position and the reference gas position with a fixed current distance between the reference gas peak and the target gas peak, at a certain temperature, and the shift thereof due to temperature drift.

In a schematic illustration, FIG. 4 shows, by way of example, the wavelength position of a target gas and that of a reference gas at a certain target temperature, wherein the two positions have a defined wavelength distance $\Delta\lambda_{DC}$ with respect to one another, which via the DC tunability curve leads to a current distance $\Delta I$. The absorption lines are shown with solid lines for the target temperature and with dotted lines for a drift induced by the reduced target temperature. The wavelength distance $\Delta\lambda_{DC}$ is typically set by a constant current distance $\Delta I$. Due to the non-linear DC tuning behavior of the laser, a shift (drift) of the operating point, for example as a result of the influence of the outside temperature of the sensor on the temperature stabilization or aging of the laser/electronics, results in a distance error $\Delta I_F$ for the position of the gas peak of the target gas GZ, resulting in measurement errors. The figure schematically shows the positions of the reference gas and the target gas at the time of calibration. Drift causes the position of the reference gas line to be shifted. Due to the non-linear relationship between the wavelength and the laser current, a difference, which is to say an incorrect wavelength having a wavelength distance error $\Delta\lambda_F$, that is, a distance error between the calculated and the actual target gas position, results for a fixed current distance $\Delta I$. In the most favorable case, the error is small (typically <20 µA), and the sensor remains within the specification thereof in terms of the accuracy of the concentration. If the error grows larger, the error increases in a superlinear fashion. In the extreme case, the peak will no longer even be in the tuning range (for example, the target gas is no longer even measured in FIG. 4). The greater the distance between the reference gas and the target gas, the lower the allowed drift must be with this method; otherwise the distance error is >20 µA. The actual target gas position (associated base current) is at pos. 1, and the target gas position calculated via formulas F1 to F2 (associated base current) is at pos. 2. These two target gas positions deviate from one another by the distance error $\Delta I_F$. It should be noted that the DC tunability curve itself is shown unimpaired by drift. In reality, the DC tunability curve itself can also change with long-term drift.

Figure 5:
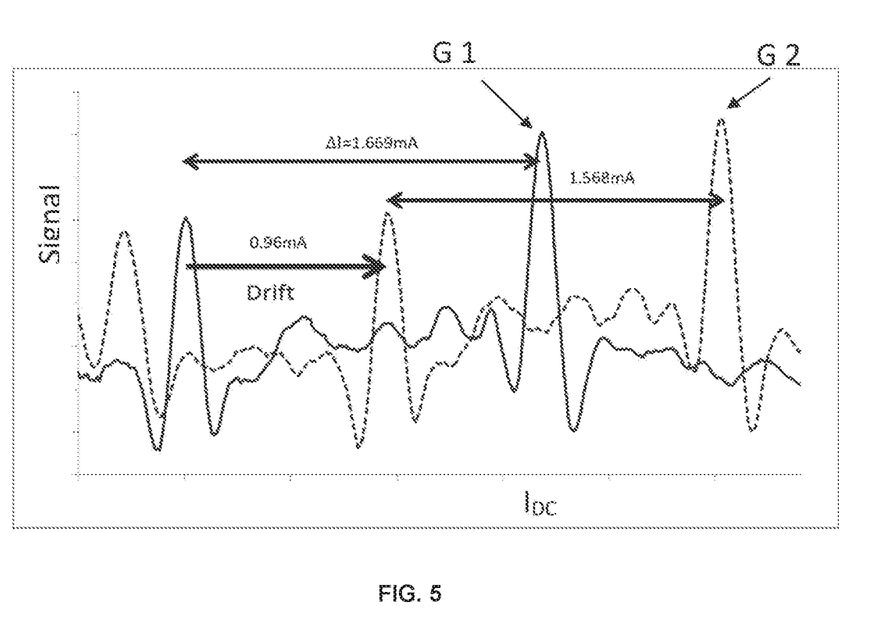
FIG. 5 shows a measuring curve for methane, serving as the reference gas and a further target gas, and ethane, serving as the target gas, at the target temperature (solid line) and after the drift (dotted line) caused by a change in the laser temperature.
Figure 6:
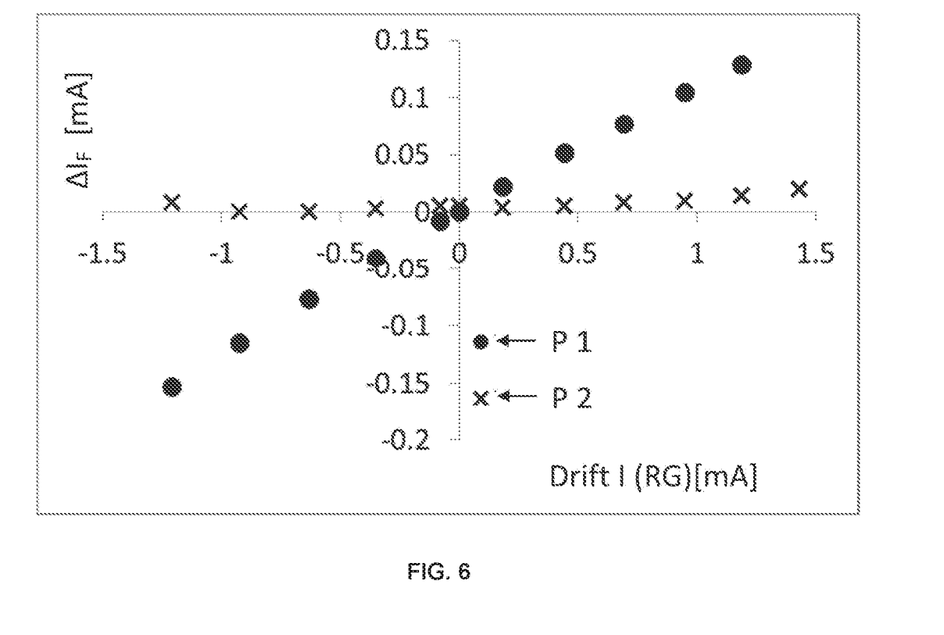
FIG. 6 shows the distance error with respect to the target gas peak compared to the drift of the reference gas peak, measured using a fixed current difference and a fixed relative temperature difference based on an example.

FIG. 5 shows, by way of example, a measuring curve, which is to say a spectrum for methane $CH_4$, having a lower peak, as the reference gas, and ethane $C_2H_6$, having a higher peak, as the target gas, at a certain target temperature (solid line G 1) and a temperature deviating from the target temperature (dotted line G 2). The deviation of line G 1 from line G 2 is caused by a change in the laser temperature and is intended to illustrate the influence of drift on the distance of the gas peaks. By way of example, the distance error $\Delta I_F$ is shown which results when, proceeding from a reference gas peak (here $CH_4$) having a fixed current distance, a target gas (ethane $C_2H_6$) is measured at a slightly different laser temperature. A shift in the reference gas peak by 0.96 mA results from the temperature reduction. It is apparent that the actual distance between the reference peak and the target gas peak has decreased from 1.669 mA to 1.568 mA. As was already mentioned above, this is caused by the non-linear DC tunability of the laser light source. A distance error $\Delta I_F$ of approximately 100 µA thus results. If the proposed method is applied using a fixed relative temperature change (formula (F 15)), the distance error $\Delta I_F$ is only 10 µA (FIG. 6). As a result, the target gas signal can be evaluated correctly.

FIG. 6 illustrates the dependence of the distance error $\Delta I_F$ on the drift values based on an example. This shows the distance error $\Delta I_F$ for the use of a fixed current difference according to formula (F 1) and a fixed relative temperature difference according to formula (F 15) for different drift values. The values based on formula F 1 are shown as dots P 1, and the values based on formula F 15 are shown as crosses P 2. It is apparent that, when using the proposed method, the distance error $\Delta I_F$ of the base current $I_{DC}$ never exceeds 20 µA, which is sufficiently small to ensure that the measured concentration remains within the specifications.

Figure 7:
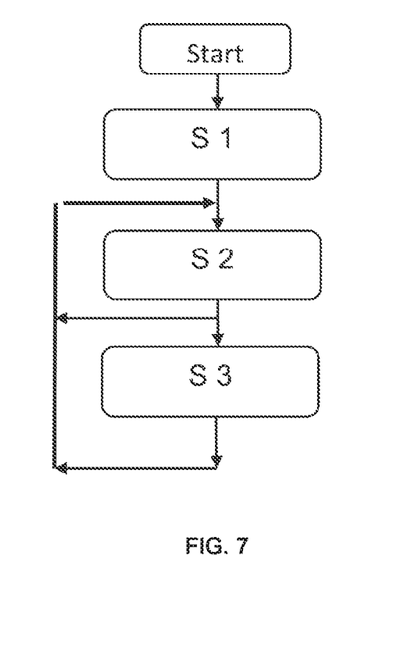
FIG. 7 shows a flow chart for fixing the wavelength distance to a reference wavelength.

FIG. 7 shows a flow chart for fixing the wavelength distance to a reference wavelength. In a first method step S1, which is to say during the calibration of the measuring system 1, firstly the DC base currents of the peak positions of the reference gas and the target gas are established and, secondly, the electrical DC power dropping across the internal resistance of the laser is ascertained for the two peak positions by determining the internal resistance of the laser at the respective current position. Thirdly, the power difference $\Delta P_{DC,cal}$ of the DC powers is ascertained and stored in the sensor.

In the subsequent second method step S2, which is to say during operation of the measuring system 1, initially the electrical DC power dropping across the internal resistance of the laser is ascertained for the instantaneous peak position of the reference gas by measuring the internal resistance using lock-in technology, then the instantaneous electrical DC power at the peak position for the target gas is calculated by adding the instantaneous DC power for the reference gas peak and the DC power difference between the reference gas and the target gas ascertained during calibration. Thereafter, the DC current for the peak position thereof is ascertained, wherein according to formula F 11 or F 15 the internal resistance of the target gas from the preceding measurement is used for this purpose. If F 15 is used, additionally the ratio of the instantaneous laser temperature to the calibration laser temperature is used. The laser temperature is stored at the time of calibration.

In the subsequent third method step S3, the actual measuring scan for the target gas is carried out based on the ascertained peak position for the target gas, and the gas concentration is ascertained therefrom.

The method steps S2 and S3 are preferably carried out multiple times in a loop, wherein the base current $I_{DC\_ZG}$ for the target gas position can be adapted between the runs, if the instantaneous base current $I_{DC\_ZG,\,act}$ deviates from the ideal base current $I_{DC\_ZG,\,cal}$, which was ascertained during the calibration of the optical measuring system.

The invention claimed is:

1. A method for operating an optical measuring system for measuring concentration of a target gas in a measured gas, comprising a wavelength-tunable temperature-stabilized laser light source, provided that an instantaneous base current $I_{DC\_ZG,act}$ corresponding to a wavelength $\Delta_{ZG}$ of a target gas absorption line being set so that, after a calibration, a wavelength distance $\Delta\lambda_{DC}$ between the wavelength $\lambda_{ZG}$ of the target gas absorption line for a target gas and a wavelength $\lambda_{RG}$ of a reference gas absorption line for a reference gas component is maintained for an instantaneous base current $I_{DC\_ZG,act}$ of the target gas and of an instantaneous base current $I_{DC\_RG,act}$ of the reference gas, wherein carrying out the calibration of the measuring system with a reference gas and a target gas, and during calibration:

establishing base currents $I_{DC\_RG,cal}$ and $I_{DC\_ZG,cal}$ assigned to the gas absorption lines for the reference gas and for the target gas;

determining associated electrical powers $P_{DC\_RG,cal}$ and $P_{DC\_ZG,cal}$ of the laser light source from the base currents $I_{DC\_RG,cal}$ and $I_{DC\_ZG,cal}$ and associated internal resistances $R_{I\_RG,cal}$ and $R_{I\_ZG,cal}$;

finding a power difference $\Delta P_{DC,cal}$ by means of the electrical powers $P_{DC\_RG,cal}$ and $P_{DC\_ZG,cal}$ and storing this or equivalent variables in the measuring system, and during operation of the measuring system, maintaining a temperature difference in the laser light source, defined in advance during the calibration, between operating points selected at a time of calibration of the reference gas, with the base current $I_{DC\_RG,cal}$ ascertained during the calibration and the target gas, with the base current $I_{DC\_ZG,cal}$ ascertained during the calibration, by way of determining a necessary instantaneous base current $I_{DC\_ZG,act}$ for the target gas, as a function of the instantaneous base current $I_{DC\_RG,act}$ for the reference gas, wherein ascertaining an instantaneous electrical power $P_{DC\_RG,act}$ of the laser source assigned to the gas absorption line for the reference gas from the instantaneous base current $I_{DC\_RG,act}$ and an instantaneous internal resistance $R_{I\_RG,act}$;

determining an instantaneous electrical power $P_{DC\_ZG,act}$ of the laser source assigned to the gas absorption line for the target gas as the sum from the instantaneous electrical power $P_{DC\_RG,act}$ and the power difference $\Delta P_{DC,cal}$; and calculating the assigned instantaneous base current $I_{DC\_ZG,act}$ from the instantaneous electrical power $P_{DC\_ZG,act}$ of the laser source, taking the instantaneous internal resistance $R_{I\_RG,act}$ into consideration.

2. The method according to claim 1, wherein during operation of the measuring system, taking into consideration changes in a base laser temperature $T_{L,cal}$ of the laser light source by adapting the power difference $\Delta P_{DC,cal}$.

3. The method according to claim 1, wherein determining an internal resistance RI of the laser light source of the reference gas and the target gas from a respective slope of a voltage/current characteristic of the laser light source associated with the instantaneous base current $I_{DC\_RG,act}$ or $I_{DC\_ZG,act}$.

4. An optical measuring system for measuring concentration of a target gas in a measured gas, comprising a wavelength-tunable temperature-stabilized laser light source, provided that an instantaneous base current $I_{DC\_ZG,act}$ corresponding to a wavelength $\lambda_{ZG}$ of a target gas absorption line is set so that, after a calibration, a wavelength distance $\Delta\lambda_{DC}$ between the wavelength $\lambda_{ZG}$ of the target gas absorption line for a target gas and a wavelength $\lambda_{RG}$ of a reference gas absorption line for a reference gas component is maintained for an instantaneous base current $I_{DC\_ZG,act}$ of the target gas and of an instantaneous base current $I_{DC\_RG,act}$ of the reference gas, wherein the measuring system is designed to be calibrated with a reference gas and a target gas, and during calibration:

base currents $I_{DC\_RG,cal}$ and $I_{DC\_ZG,cal}$ assigned to the gas absorption lines for the reference gas and for the target gas are established;

associated electrical powers $P_{DC\_RG,cal}$ and $P_{DC\_ZG,cal}$ of the laser light source from the base currents $I_{DC\_RG,cal}$ and $I_{DC\_ZG,cal}$ and associated internal resistances $R_{I\_RG,cal}$ and $R_{I\_ZG,cal}$ are determined;

a power difference $\Delta P_{DC,cal}$ by means of the electrical powers $P_{DC\_RG,cal}$ and $P_{DC\_ZG,cal}$ is found and this or equivalent variables are stored in the measuring system, and wherein the measuring system is designed in such that during operation a temperature difference in the laser light source, defined in advance during the calibration, between operating points selected at a time of calibration of the reference gas, with a base current $I_{DC\_RG,cal}$ ascertained during the calibration and the target gas, with a base current $I_{DC\_ZG,cal}$ ascertained during the calibration, by way of determining a necessary instantaneous base current $I_{DC\_ZG,act}$ for the target gas, as a function of an instantaneous base current $I_{DC\_RG,act}$ for the reference gas is maintained, an during operation:

an instantaneous electrical power $P_{DC\_RG,act}$ of the laser source assigned to the gas absorption line for the reference gas from the instantaneous base current $I_{DC\_RG,act}$ and an instantaneous internal resistance $R_{I\_RG,act}$ is ascertained;

an instantaneous electrical power $P_{DC\_ZG,act}$ of the laser source assigned to the gas absorption line for the target gas as a sum from the instantaneous electrical power $P_{DC\_RG,act}$ and the power difference $\Delta P_{DC,cal}$ is determined;

the assigned instantaneous base current $I_{DC\_ZG,act}$ from the instantaneous electrical power $P_{DC\_ZG,act}$ of the laser source is calculated, taking the instantaneous internal resistance $R_{I\_RG,act}$ into consideration.

5. The optical measuring system according to claim 4, additionally comprising: a modulation device for providing a base current $I_{DC}$ and a modulation current $I_{AC}$ for the laser light source; a measured gas; a light detector, and an evaluation unit connected to the light detector and the modulation device; a voltage detector configured to detect a voltage $U_L$ present at the laser light source; a temperature detector configured to detect a laser base temperature $T_L$; a resistance detector configured to ascertain an internal resistance $R_I$ of the laser light source, and a processor configured to control base currents Ix for a reference gas and the target gas, wherein the laser light source is designed to em it a laser beam of a wavelength $\lambda_{DC}$ having a wavelength modulation amplitude $\Delta\lambda_{AC}$, and the modulation device is designed to periodically vary the wavelength of the laser light of the laser light source by way of the absorption line for the reference gas and the absorption line for the target gas at an operating point and, at the same time, to modulate the same with a frequency and a settable amplitude, the modulation device is directly connected to the laser light source; the light detector is designed to detect the laser beam originating from the laser light source after this has passed through the measured gas, and to generate a reception signal, which is dependent on an intensity of the laser light after it has passed through the measured gas and is supplied to the evaluation unit; wherein the voltage detector for detecting the voltage $U_L$ present at the laser light source, the temperature detector for detecting the laser base temperature $T_L$, the resistance detector for ascertaining the internal resistance $R_I$ of the laser light source, and the processor for controlling the base currents $I_{DC}$ for the reference gas and the target gas are configured to cooperate so as to detect the voltage $U_L$ present at the laser light source and determine the internal resistance $R_I$ and, as a function thereof, control the base currents $I_{DC}$ for the reference gas and the target gas using the modulation device so as to keep the wavelength distance between the reference gas and the target gas constant.

* * * * *